(12) United States Patent
Delage et al.

(10) Patent No.: US 6,373,284 B1
(45) Date of Patent: Apr. 16, 2002

(54) VOLTAGE LEVEL SHIFTING CIRCUIT FOR BIDIRECTIONAL DATA

(75) Inventors: Christelle Delage, Tournefeuille; Quang Nguyen, Castanet-Tolosan, both of (FR)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/637,685

(22) Filed: Aug. 14, 2000

(51) Int. Cl.$^7$ ............................................ H03K 19/0175
(52) U.S. Cl. .............................. 326/80; 326/81; 327/333
(58) Field of Search ............................... 326/80, 81, 62, 326/63, 21, 22, 23, 24, 25; 327/333, 391

(56) References Cited

U.S. PATENT DOCUMENTS

| | | | |
|---|---|---|---|
| 4,061,929 A | * 12/1977 | Asano | 327/589 |
| 4,080,539 A | * 3/1978 | Stewart | 326/80 |
| 4,595,847 A | * 6/1986 | Weir | 327/382 |
| 5,479,116 A | 12/1995 | Sallaerts et al. | 326/80 |
| 5,528,172 A | 6/1996 | Sundstrom | 326/80 |
| 5,646,548 A | 7/1997 | Yao et al. | 326/80 |
| 5,666,070 A | 9/1997 | Merritt et al. | 326/81 |
| 5,680,063 A | * 10/1997 | Ludwig et al. | 326/80 |
| 5,742,183 A | 4/1998 | Kuroda | 326/81 |
| 5,748,010 A | 5/1998 | Haque | 326/80 |
| 5,808,502 A | * 9/1998 | Hui et al. | 327/333 |
| 5,870,573 A | * 2/1999 | Johnson | 710/131 |
| 5,896,044 A | 4/1999 | Walden | 326/80 |
| 5,933,043 A | 8/1999 | Utsunomiya et al. | 327/333 |
| 6,043,549 A | 3/2000 | Gutierrez-Aitken | 257/458 |
| 6,043,698 A | 3/2000 | Hill | 327/333 |

* cited by examiner

Primary Examiner—Tuan T. Lam

(57) ABSTRACT

A voltage leveling circuit (20) for use as a bi-directional device to translate logic states represented by a first voltage level to logic states represented by a second voltage level. Voltage leveling circuit uses pass transistor (34) and pass transistor (36) connected in a serial fashion to control current flow between the first data terminal ($D_1$) and the second data terminal ($D_2$). Once current flow is controlled, pull up resistors (46) and (52) are used to perform the voltage level shifting. Two stage ESD protection is provided for gate oxide regions of pass transistors (34) and (36). A control terminal($E_1$) is provided to allow an external disable/enable signal to control the operation of voltage leveling circuit (20).

15 Claims, 3 Drawing Sheets

VOLTAGE LEVEL SHIFTING CIRCUIT FOR BIDIRECTIONAL DATA

BACKGROUND OF THE INVENTION

The present invention relates in general to voltage level shifting circuits and, more particularly, to bi-directional voltage level shifting circuits.

Recent advances in the field of semiconductor integrated circuits have brought about higher levels of integration. Semiconductor manufacturing process advancements are driving the corresponding geometric dimensions for semiconductor devices to decreasingly smaller values. As device dimensions shrink, the number of devices per unit area of semiconductor die grows. Given higher device densities within semiconductor die, a greater opportunity exists that devices, which must interface to one another, operate at incompatible drive levels.

An example of incompatible drive levels can be found in the field of digital cellular telephones where a microcontroller communicates with a smart card reader. The smart card reader interrogates the digital cellular mobile subscriber's smart card and must then relay subscriber authentication data to the micro-controller, which in turn authenticates the mobile user and returns confirmation data to the smart card. Such micro-controllers typically operate in the range of 2.7 to 6.0 volts and such smart card readers operate at approximately either 3 or 5 volts. As the two devices communicate, a series of data bits represented by logic values "0" and "1" are exchanged. A logic "0" is represented by both the smart card reader and the micro-controller as 0 volts. A logic "1", however, is represented by 6 volts, for example, by the micro-controller and 3 volts, for example, by the smart card reader. The logic "1" must be translated by a voltage level shifting device which will translate a 6 volt logic "1" signal to a 3 volt logic "1" signal for the case when the micro-controller is attempting to communicate a logic "1" to the smart card reader. The voltage level shifting device must also be capable of translating data transmission in the opposite direction, or bi-directionally, such as is the case when the smart card reader is attempting to communicate to the micro-controller.

FIG. 1 displays prior art voltage leveling circuit 12 as required to provide adequate voltage level translation for network 10. Prior art voltage level shifting circuit 12 is shown which translates digital voltage levels between communication devices connected to terminal $D_1$ and terminal $D_2$ Communications device connected to terminal $D_1$ is operating from supply potential $V_{dd1}$ and communication device connected to terminal $D_2$ is operating from supply potential $V_{dd2}$ where $V_{dd1}$ and $V_{dd2}$ are at different potential levels. Prior art circuit 12 is employed to translate incompatible data signals exchanged between the two communications devices. Many prior art voltage level shifting devices typically employ a single translating transistor 16. Pass transistor 16 is typically an NMOS transistor whose symmetrical structure enables bi-directional voltage level shifting. A complex bias circuit 14 is connected to the gate of pass transistor 16 and also to the two operating voltage supplies $V_{dd1}$ and $V_{dd2}$.

To enable the prior art voltage level shifting circuit 12 to correctly translate voltage levels between communications device connected to terminal $D_1$ and communications device connected to terminal $D_2$, bias circuit 14 must perform the following functions. Bias circuit 14 must determine the lesser of the two operating voltages, $V_{dd1}$ or $V_{dd2}$. Once the minimum voltage level is known, the minimum voltage level must be used to bias the gate of pass transistor 16. The minimum gate voltage is required to bias the gate of pass transistor 16 so as to enable the data transmitted on terminals $D_1$ and $D_2$ to properly bias pass transistor 16 into its on and off state. These functional requirements imposed on bias circuit 14 render the prior art voltage leveling circuit 12 as complex and costly. In addition, the prior art voltage leveling circuit 12 does not protect against electrostatic discharge (ESD) destruction of the gate oxide of pass transistor 16 nor does it provide a method to enable or disable data transfer between terminals $D_1$ and $D_2$.

Hence, a need exists for a voltage level shifting device which does not require complex biasing circuitry, provides for adequate ESD protection and allows for an enabling or disabling of the voltage leveling function.

DETAILED DESCRIPTION OF THE PREFERRED EMBODIMENT

Figure 1:
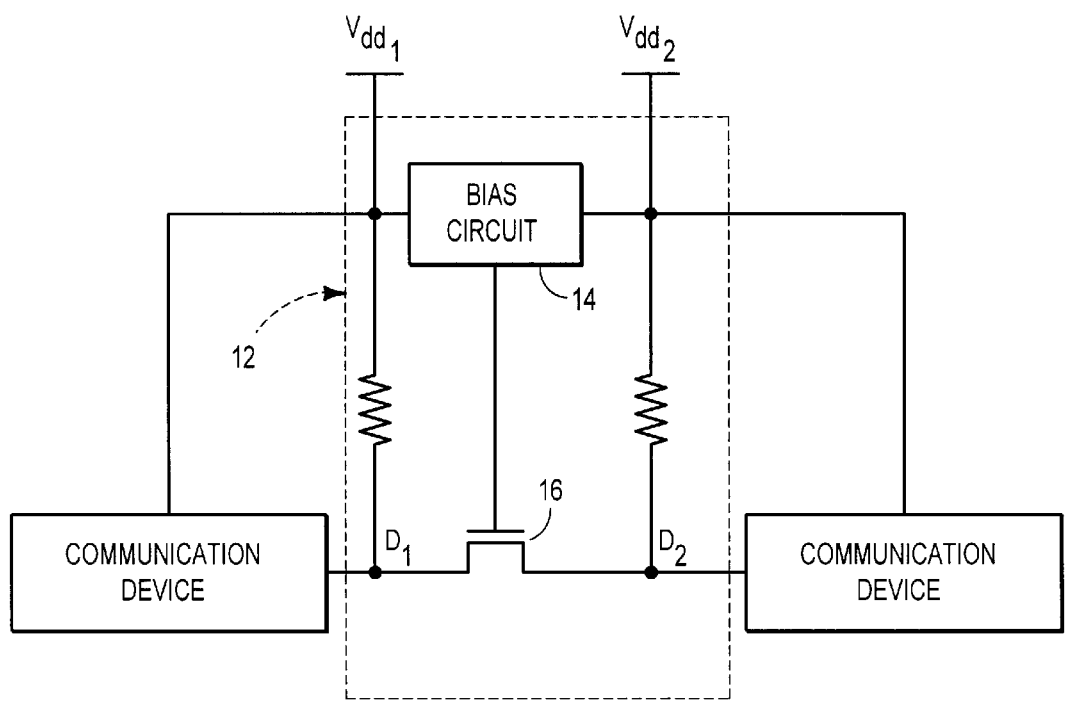
FIG. 1 illustrates a schematic diagram of a prior art voltage leveling circuit operating within a communications network.
Figure 2:
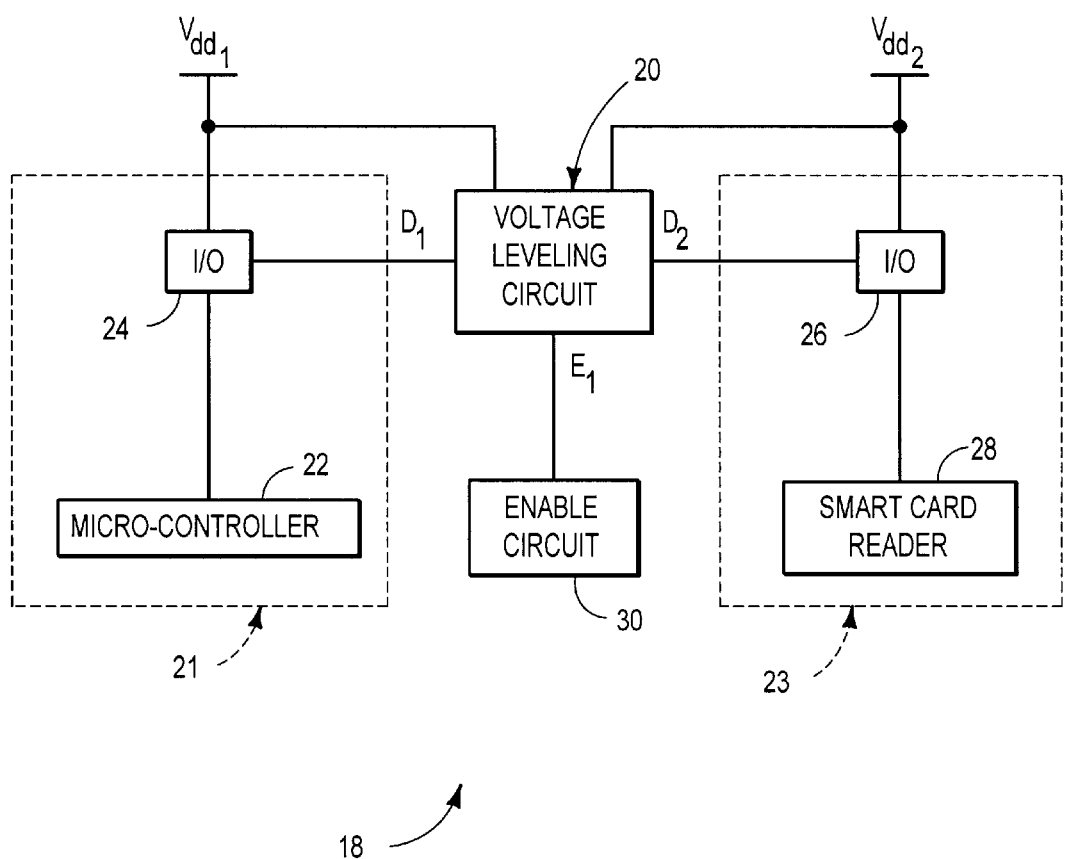
FIG. 2 illustrates a voltage leveling circuit operating within a communications network.

Referring to FIG. 2, communications network 18 displays an example configuration whereby a micro-controller 22 conducts bi-directional data communications, utilizing Input/Output (I/O) device 24. The combination of micro-controller 22 and I/O device 24 comprise an example communication device 21. A smart card reader 28, conducts bi-directional data communications utilizing I/O device 26, where the combination of smart card reader and I/O device 26 comprise an example communication device 23. Micro-controller 22 and smart card reader 28 perform many separate and distinctly independent functions which do not pertain to the present invention, but nevertheless, communicate with each other in order to collaboratively perform system level functions through the use of the present invention. I/O device 24 operates from supply potential $V_{dd1}$ and I/O device 26 operates from supply potential $V_{dd2}$. Communication data streams transmitted and received by I/O circuit 24 at node $D_1$ fluctuate between a minimum voltage level represented by approximately 0 volts to a maximum voltage level approximated by the voltage present at terminal $V_{dd1}$. Communication data streams transmitted and received by I/O circuit 26 at node $D_2$ fluctuate between a minimum voltage level represented by approximately 0 volts to a maximum voltage level approximated by the voltage present at terminal $V_{dd2}$. Voltage leveling circuit 20 is typically implemented using an integrated circuit (IC). The IC package is typically a 4–8 pin device providing supply voltage input pins at terminal $V_{dd1}$ and at terminal $V_{dd2}$, data input pins at terminal $D_1$ and terminal $D_2$ and an enable signal input pin at terminal $E_1$. Enable circuit 30 provides a logic "1" at terminal $E_1$ to disable the transmission path between I/O device 24 and I/O device 26 and a logic "0" to enable the transmission path between I/O device 24 and I/O device 26.

Figure 3:
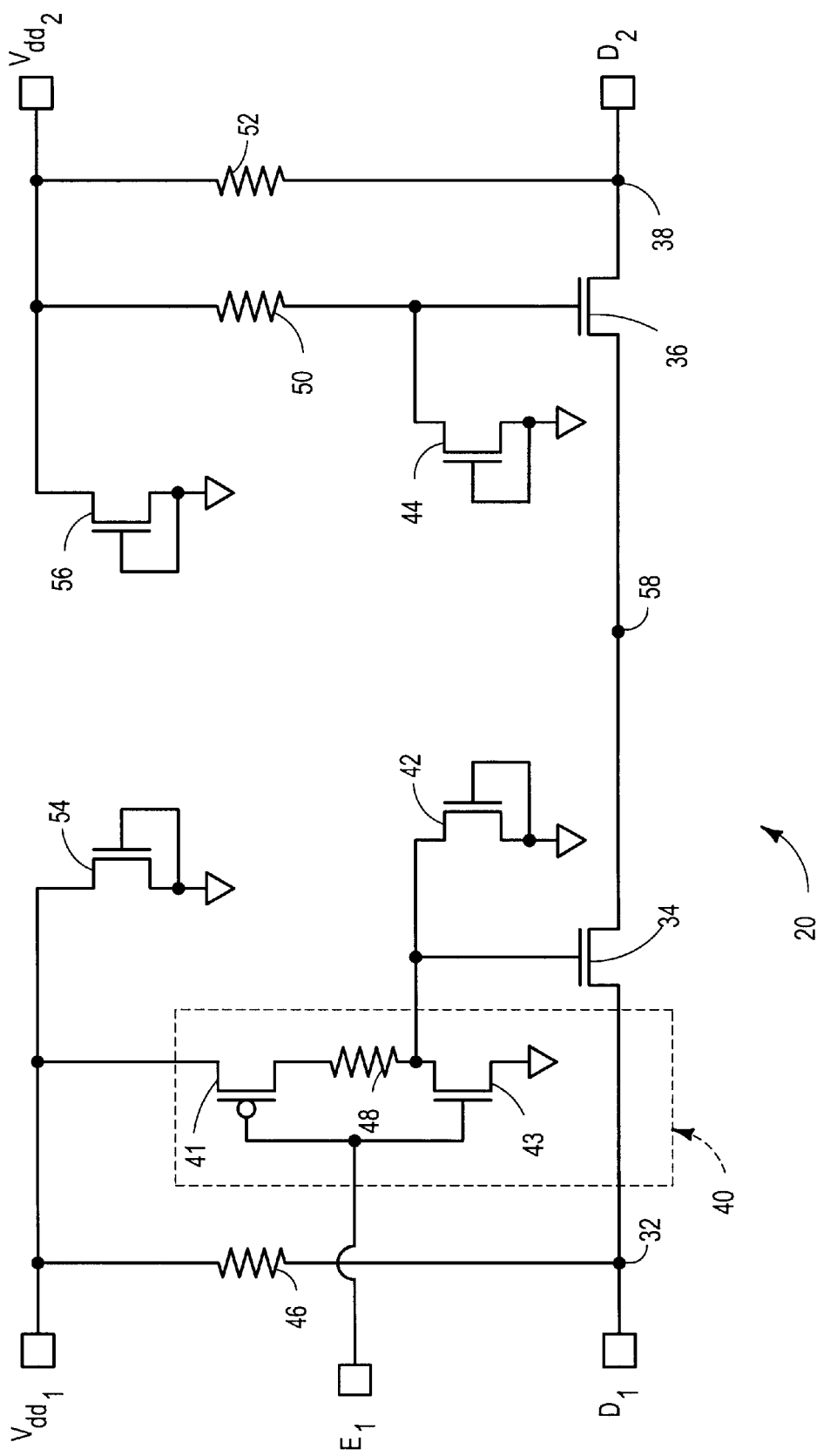
FIG. 3 is a detailed schematic diagram of the voltage leveling circuit of FIG. 2.

FIG. 3 illustrates a detailed schematic of voltage leveling circuit 20. A conduction terminal of pass transistor 34 and a conduction terminal of pass transistor 36 are coupled at node 58 to form a serial connection. A conduction terminal of pass transistor 34 is coupled to terminal $D_1$ at node 32 which represents the first I/O connection to voltage leveling circuit 20. A conduction terminal of pass transistor 36 is coupled to terminal $D_2$ at node 38 which represents the second I/O connection to voltage leveling circuit 20.

Pass transistor 34 and pass transistor 36 are typically N-type, Metal Oxide Semiconductor (NMOS) devices. NMOS device 34 and NMOS device 36 are necessarily formed as symmetrical devices such that the source and drain dopant regions are substantially identical with respect to width, length and depth. Since device 34 and device 36 are symmetrical, conduction terminals coupled to their respective source and drain regions can be used interchangeably with identical results.

The voltage bias level at the gate of pass transistor 34 is set substantially to the potential at terminal $V_{dd1}$ by placing a logic "0" at terminal $E_1$. The voltage bias level at the gate of pass transistor 36 is set substantially to the potential at terminal $V_{dd2}$ by coupling the gate of pass transistor 36 to terminal $V_{dd2}$ through resistor 50. Pass transistor 34 is in the on state, or conductive state, when terminal $D_1$ is at ground potential, or logic "0", since the gate voltage of pass transistor 34 exceeds the voltage present at node 32 by a value which is larger than the threshold voltage of pass transistor 34. Pass transistor 36 is in the on state, or conductive state, when terminal $D_2$ is at ground potential, or logic "0", since the gate voltage of pass transistor 36 exceeds the voltage present at node 38 by a value which is larger than the threshold voltage of pass transistor 36.

$V_{dd1}$ and $V_{dd2}$ are at different voltage potentials. $V_{dd1}$ can be smaller than $V_{dd2}$ or the reverse can be true with $V_{dd2}$ smaller than $V_{dd1}$. In order to fully understand the operation of voltage leveling circuit 20, a detailed analysis of a logic "0" to logic "1" transition at terminals $D_1$ and $D_2$ and a logic "1" to logic "0" transition at terminals $D_1$ and $D_2$ will be analyzed for both relative variations of $V_{dd1}$ and $V_{dd2}$.

CASE 1 ($V_{dd1} < V_{dd2}$)

Phase 1 of the analysis begins with terminal $D_1$ at logic "0" and terminal $D_2$ at logic "0". Pass transistor 34 is on, or is in a conductive state, because the gate potential of transistor 34 exceeds the potential at node 32 by a value that is greater than the threshold voltage of pass transistor 34. Pass transistor 36 is on, or is in a conductive state, because the gate potential of transistor 36 exceeds the potential at node 58 by a value that is greater than the threshold voltage of pass transistor 36.

Phase 2 of the analysis begins with a logic "0" to logic "1" transition at terminal $D_1$ initiated by the output of I/O device 24 transitioning into a high impedance state. The on resistance of pass transistors 34 and 36 is assumed to be negligible with respect to the resistance values of resistors 46 and 52. An alternating current (AC) equivalent circuit, therefore, is created for phase 2, which consists of resistor 46 and resistor 52 in parallel together with capacitive loads provided at nodes 32 and 38 by I/O devices 24 and 26, respectively, shown in FIG. 2. The low to high voltage transition at node 32, therefore, follows an exponential function defined by $V(1-e^{-t/RC})$, where V is the voltage approximated by $V_{dd1}$, R is the parallel combination of resistors 46 and 52, C is the combined parallel capacitive load provided by I/O devices 24 and 26 and t is the time variable. The RC time constant, T, is defined by $T=R_1R_2(C_1+C_2)/(R_1+R_2)$, where $R_1$ is resistor 46, $R_2$ is resistor 52, $C_1$ is the load capacitance supplied by I/O device 24 shown in FIG. 2 and $C_2$ is the load capacitance supplied by I/O device 26 shown in FIG. 2.

Phase 3 of the analysis starts when the voltage at node 32 reaches a value equal to $V_{dd1}-V_{T1}$. $V_{T1}$ is the threshold voltage of transistor 34 and marks the point at which transistor 34 turns off, transitioning to the non-conductive state. Once transistor 34 has become non-conductive, the current path between nodes 32 and 38 through transistors 34 and 36 becomes discontinuous and the drain current of transistors 34 and 36 transitions to 0 amps. Transistor 36 remains on, since $V_{dd2}$ exceeds $V_{dd1}$, and the voltage at node 58 follows the voltage at node 38. The voltage at node 38 approaches $V_{dd2}$ exponentially where the time constant is now set by resistor 52 and the capacitive load provided by I/O device 26.

Phase 4 begins as the voltage at node 58 reaches a value of $V_{dd2}-V_{T2}$ volts, where $V_{T2}$ is the threshold voltage of transistor 36. Transistor 36 turns off and transitions to a non-conductive state while the voltage at node 58 stabilizes at a voltage level between voltage $V_{dd1}$ and $V_{dd2}$. The voltage at node 38 continues to exponentially rise until reaching a value approximating $V_{dd2}$ volts, representing a logic "1" at node $D_2$.

Phase 5 begins the logic "1" to logic "0" transition at terminal $D_1$. I/O device 24 places a ground potential at node 32. Transistor 34 subsequently turns on, transitioning to a conductive state, since the gate voltage of transistor 34 exceeds the voltage at node 32 by a value greater than the threshold voltage of transistor 34. Voltage at node 58 follows the voltage at node 32 which is at ground potential. Transistor 36 turns on, transitioning to a conductive state, since the gate voltage of transistor 36 exceeds the voltage at node 58 by a value greater than the threshold voltage of transistor 36. The voltage at node 38 follows the voltage at node 58 which results in a ground potential, or logic "0", being applied at node 38 which is then transferred to I/O device 26 by terminal $D_2$. The A/C equivalent circuit during phase 5 contains only the capacitance provided by the outputs of I/O devices 24 and 26 in series with the respective on resistance values of transistors 34 and 36. The A/C equivalent circuit defines a voltage drop at nodes 32 and 38 which approaches ground potential exponentially. The time constant is set by the summation of the on resistance values of transistors 34 and 36 and the series combination of the capacitance contributed by I/O devices 24 and 26.

CASE 2 ($V_{dd1} > V_{dd2}$)

Phase 1 and phase 2 analyses for case 2 are identical to the analyses presented herein for phase 1 and phase 2 of case 1.

Phase 3 of the analysis starts when the voltage at node 38 reaches a value equal to $V_{dd2}-V_{T2}$. $V_{T2}$ is the threshold voltage of transistor 36 and marks the point at which transistor 36 turns off, transitioning to the non-conductive state. Once transistor 36 has become non-conductive, the current path between nodes 32 and 38 through transistors 34 and 36 becomes discontinuous and the drain current of transistors 34 and 36 transitions to 0 amps. The voltage at node 38 exponentially increases to a value approximated by $V_{dd2}$ with a time constant set by resistor 52 and the capacitive load provided by I/O device 26. Transistor 34 remains on, since $V_{dd1}$ exceeds $V_{dd2}$, and the voltage at node 58 follows the voltage at node 32. The voltage at node 32 approaches $V_{dd1}$ exponentially, where the time constant is set by resistor 46 and the capacitive load provided by I/O device 24.

Phase 4 begins as the voltage at node 58 reaches a value of $V_{dd1}-V_{T1}$ volts, where $V_{T1}$ is the threshold voltage of transistor 34. Transistor 34 turns off and transitions to a non-conductive state while the voltage at node 58 stabilizes at a voltage level between voltage $V_{dd1}$ and $V_{dd2}$. The voltage at node 32 continues to exponentially rise until reaching a value approximating $V_{dd1}$ volts, representing a logic "1" at node $D_1$. Phase 5 of case 2 is identical to phase 5 of case 1.

Proper gate biasing for transistor 34 and transistor 36 is an important feature of the present invention. Biasing of the control terminals of transistor 34 and 36, as shown in FIG. 3, is required such that one of the transistors is turned off, or is in a non-conductive state, at some point during a low to high transition at either of data terminals $D_1$ or $D_2$. Control of transistors 34 and 36, which are used as current switches, is performed at the conduction terminals by the data exchanged between I/O devices 24 and 26. Data exchanged between I/O devices 24 and 26 causes the voltage at the conduction terminals of pass transistors 34 and 36 to approximately equal the voltage at the gate terminals of transistors 34 and 36, creating a condition of insufficient gate to source terminal bias required to maintain transistors 34 and 36 in a conductive state. Once transistor 34 has entered a non-conductive state, pull-up resistor 46 is required to pull node 32 to a voltage approximating $V_{dd1}$. Once transistor 36 has entered a non-conductive state, pull-up resistor 52 is required to pull node 38 to a voltage approximating $V_{dd2}$. Voltage leveling circuit 20 is rendered inoperative should both transistor 34 and transistor 36 remain in a conductive state at the end of a low to high data transition at either of data terminals $D_1$ or $D_2$. During the inoperative state where transistor 34 and transistor 36 remain conductive subsequent to a low to high transition at either of data terminals $D_1$ or $D_2$, a current path exists within voltage leveling circuit 20 which causes erroneous data values to be presented at both data terminals $D_1$ and $D_2$. The current path extends from terminal $V_{dd1}$ through resistor 46, through node 32, through transistor 34, through node 58, through transistor 36, through node 38, through resistor 52 and finally to terminal $V_{dd2}$. The voltage at nodes 32 and 38 stabilizes to an average value bounded by voltages $V_{dd1}$ and $V_{dd2}$. An average voltage value between $V_{dd1}$ and $V_{dd2}$ existing at nodes 32 and 38 at the end of a low to high data transition is an error condition, which provides inaccurate results when I/O devices 24 and 26 are attempting to communicate. When correct biasing at the gate terminal of transistors 34 and 36 exists, as shown in FIG. 3, the voltage leveling circuit 20 becomes operative. When voltage leveling circuit 20 is operative, a voltage substantially equal to $V_{dd1}$ exists at node 32 and a voltage substantially equal to $V_{dd2}$ exists at node 38, subsequent to a low to high data transition at either of data terminals $D_1$ or $D_2$.

Transistor 34 and transistor 36 are symmetrical devices that allow bi-directional data transmission. Initiation of a low to high voltage transition at node $D_2$ with a resulting low to high voltage transition at node $D_1$ is analyzed by cases 3 and 4 discussed hereafter. Case 3 assumes that voltage at terminal $V_{dd2}$ is less than the voltage at terminal $V_{dd1}$. Case 4 assumes that voltage at terminal $V_{dd2}$ is greater than the voltage at terminal $V_{dd1}$.

CASE 3 ($V_{dd2} < V_{dd1}$)

Phase 1 of the analysis begins with terminal $D_1$ at logic "0" and terminal $D_2$ at logic "0". Pass transistor 34 is on, or is in a conductive state, because the gate potential of transistor 34 exceeds the potential at node 58 by a value that is greater than the threshold voltage of pass transistor 34. Pass transistor 36 is on, or is in a conductive state, because the gate potential of transistor 36 exceeds the potential at node 38 by a value that is greater than the threshold voltage of pass transistor 36.

Phase 2 of the analysis begins with a logic "0" to logic "1" transition at terminal $D_2$ initiated by the output of I/O device 26 transitioning into a high impedance state. The on resistance of pass transistors 34 and 36 is assumed to be negligible with respect to the resistance values of resistors 46 and 52. An AC equivalent circuit, therefore, is created for phase 2, which consists of resistor 46 and resistor 52 in parallel together with capacitive loads provided at nodes 32 and 38 by I/O devices 24 and 26, respectively, shown in FIG. 2. The time constant is set by the parallel combination of resistors 46 and 52 and the combined parallel capacitive load provided by I/O devices 24 and 26. The voltage at node 38 exponentially increases to $V_{dd2}$ volts, or logic "1", following the RC time constant $T_1 = R_1 R_2 (C_1 + C_2)/(R_1 + R_2)$, where $R_1$ is resistor 46, $R_2$ is resistor 52, $C_1$ is the load capacitance supplied by I/O device 24 shown in FIG. 2 and $C_2$ is the load capacitance supplied by I/O device 26 shown in FIG. 2.

Phase 3 of the analysis starts when the voltage at node 38 reaches a value equal to $V_{dd2} - V_{T2}$. $V_{T2}$ is the threshold voltage of transistor 36 and marks the point at which transistor 36 turns off, transitioning to the non-conductive state. Once transistor 36 has become non-conductive, the current path between nodes 32 and 38 through transistors 34 and 36 becomes discontinuous and the drain current of transistors 34 and 36 transitions to 0 amps. Transistor 34 remains on, since $V_{dd1}$ exceeds $V_{dd2}$, and the voltage at node 58 follows the voltage at node 32. The voltage at node 32 approaches $V_{dd1}$ exponentially where the time constant is set by resistor 46 and the capacitive load provided by I/O device 24.

Phase 4 begins as the voltage at node 58 reaches a value of $V_{dd1} - V_{T1}$ volts, where $V_{T1}$ is the threshold voltage of transistor 34. Transistor 34 turns off and transitions to a non-conductive state while the voltage at node 58 stabilizes at a voltage level between voltage $V_{dd1}$ and $V_{dd2}$. The voltage at node 32 continues to exponentially rise until reaching a value approximating $V_{dd1}$ volts, representing a logic "1" at node $D_1$.

Phase 5 begins the logic "1" to logic "0" transition at terminal $D_2$. I/O device 26 places a ground potential at node 38. Transistor 36 subsequently turns on, transitioning to a conductive state, since the gate voltage of transistor 36 exceeds the voltage at node 38 by a value greater than the threshold voltage of transistor 36. Voltage at node 58 follows the voltage at node 38 which is at ground potential. Transistor 34 turns on, transitioning to a conductive state, since the gate voltage of transistor 34 exceeds the voltage at node 58 by a value greater than the threshold voltage of transistor 34. The voltage at node 32 follows the voltage at node 58 which results in a ground potential, or logic "0", being applied at node 32 which is then transferred to I/O device 24 by terminal $D_1$. The AC equivalent circuit during phase 5 contains only the capacitance provided by the outputs of I/O devices 24 and 26 in series with the respective on resistance values of transistor 34 and 36. The AC equivalent circuit defines a voltage drop at nodes 32 and 38 which approaches ground potential exponentially where the time constant is set by the summation of the on resistance values of transistors 34 and 36 and the series combination of the capacitance contributed by I/O devices 24 and 26.

CASE 4 ($V_{dd2} > V_{dd1}$)

Phase 1 and phase 2 analyses for case 4 are identical to the analyses presented herein for phase 1 and phase 2 of case 3.

Phase 3 of the analysis starts when the voltage at node 32 reaches a value equal to $V_{dd1} - V_{T1}$. $V_{T1}$ is the threshold voltage of transistor 34 and marks the point at which transistor 34 turns off, transitioning to the non-conductive state. Once transistor 34 has become non-conductive, the current path between nodes 32 and 38 through transistors 34 and 36 becomes discontinuous and the drain current of transistors 34 and 36 transitions to 0 amps. The voltage at node 32 exponentially approaches $V_{dd1}$ with a time constant set by resistor 46 and load capacitance provided by I/O device 24. Transistor 36 remains on, since $V_{dd2}$ exceeds $V_{dd1}$, and the voltage at node 58 follows the voltage at node 38. The voltage at node 38 approaches $V_{dd2}$ exponentially where the time constant is set by resistor 52 and the capacitive load provided by I/O device 26.

Phase 4 begins as the voltage at node 58 reaches a value of $V_{dd2}-V_{T2}$ volts, where $V_{T2}$ is the threshold voltage of transistor 36. Transistor 36 turns off and transitions to a non-conductive state while the voltage at node 58 stabilizes at a voltage level between voltage $V_{dd1}$ and $V_{dd2}$. The voltage at node 38 continues to exponentially rise until reaching a value approximating $Vdd_2$ volts, representing a logic "1" at node $D_2$. Phase 5 operation for case 4 is identical to phase 5 operation for case 3.

A second embodiment of voltage leveling circuit 20 exists when pull up resistors 46 and 52 are omitted from the integrated circuit. Omission of pull up resistors 46 and 52 facilitates external placement of pull up resistors. External placement of pull up resistors allows programming of the RC time constant involved during a low to high data transition on data terminals $D_1$ or $D_2$.

NMOS transistors 42, 44, 54 and 56 are configured as electro-static discharge (ESD) protection devices with their gate and source terminals coupled together in order to form diodes. Coupling the gate terminal to the source terminal allows diodes 42, 44, 54 and 56 to trigger, or conduct current, when the drain voltage has exceeded the diode's drain bulk avalanche breakdown voltage during an ESD event. ESD events can be destructive to the gate oxide structure of transistors 34 and 36 and the voltages that are generated as a result of an ESD event can be measured at terminals $V_{dd1}$ or $V_{dd2}$ or both with respect to ground or with respect to input data terminals $D_1$ or $D_2$. Two stage protection for transistor 34 is provided by diodes 42 and 54, whereas two stage protection for transistor 36 is provided by diodes 44 and 56. As the voltage at terminals $V_{dd1}$ and $V_{dd2}$ increases due to an ESD event, diodes 42 and 44 will trigger and clamp the voltage rise to a value equal to their respective drain bulk avalanche breakdown voltages. Transistors 42 and 44 are geometrically smaller than transistors 54 and 56 meaning that transistors 42 and 44 have larger on resistances. As the voltage at terminals $V_{dd1}$ and $V_{dd2}$ continues to increase, diodes 54 and 56 will trigger and begin to conduct the majority of the ESD current delivered to terminals $V_{dd1}$ and $V_{dd2}$. Diodes 54 and 56 are geometrically larger than diodes 42 and 44 and therefore have a greater current carrying capacity with lower on resistances. The ESD current path through transistors 54 and 56 presents a lower impedance than does the current path through transistors 42 and 44 due to the lower on resistance values of transistors 54 and 56 and due to the isolation resistance added by resistors 48 and 50.

An enable circuit 40 allows voltage leveling circuit 20 to be enabled or disabled. A logic "1" at terminal $E_1$ places transistor 43 in the on, or conductive, state which effectively grounds the gate terminal of transistor 34, rendering transistor 34 non-conductive or off. Transistor 34 is therefore an open switch, which renders node 58 into a floating node, allowing no transfer of data to occur. A logic "0" at terminal $E_1$ places transistor 41 in the on, or conductive, state which applies a voltage substantially equal to $V_{dd1}$ at the gate terminal of transistor 34, rendering transistor 34 conductive or on. Once transistor 34 is in its on, or conductive, state, normal data transfer between data nodes $D_1$ and $D_2$ can occur. The enable and disable function needs only to be applied to the gate of one of transistors 34 or 36, but not both. Transistors 34 and 36 act as current switches and since they provide series connectivity between data terminals $D_1$ and $D_2$, only one switch needs to be opened in order to disable the bi-directional voltage leveling function of circuit 20.

In summary, the present invention demonstrates a bi-directional voltage leveling circuit which facilitates data transfer between two devices operating at different voltage supply potentials without the need for complex biasing circuitry. Two serially connected pass transistors, the first transistor gate biased at a first voltage supply potential and the second transistor gate biased at a second voltage supply potential, are used to control current flow. During a low to high data transition at either of the two data input terminals, both transistors turn off at different phases of the low to high transition, thereby allowing pull up resistors to pull the voltage to the correct logic "1" potential at each respective data terminal. Two stage ESD protection is provided to protect the gate oxide of the serially connected pass transistors. A first ESD protection diode provides the first stage of ESD protection by providing a low impedance current path which provides a current sink to handle the majority of an ESD event current spike. The second stage of ESD protection clamps the gate voltage of the pass transistors to the drain bulk avalanche breakdown voltage of the second ESD protection diode. Finally, an enable terminal is provided which allows the voltage leveling circuit to be enabled or disabled by applying an appropriate logic level to the enable ($E_1$) terminal.

What is claimed is:

1. A level shifting circuit having first and second data terminals, comprising:

a first current switch having a first conduction terminal coupled to the first data terminal for receiving a signal defined to have a first state at a first level;

a second current switch having a first conduction terminal coupled to a second conduction terminal of the first current switch at a first node, a control electrode coupled to a bias terminal, and a second conduction terminal coupled to the second data terminal for providing the signal having the first state at a second level; and a voltage clamping device having an input coupled to the control electrode of the second current switch and having an output coupled to a ground potential terminal.

2. The level shifting circuit of claim 1, wherein the first current switch includes a transistor having a first conduction terminal coupled to the first data terminal, a control terminal coupled for receiving a first threshold signal, and a second conduction terminal coupled to the first node.

3. The level shifting circuit of claim 2, wherein the transistor is a symmetrical, NMOS device.

4. The level shifting circuit of claim 2, wherein the second current switch includes a transistor having a first conduction terminal coupled to the first node, a control terminal coupled to the bias terminal for receiving a second threshold signal, and a second conduction terminal coupled to the second data terminal.

5. The level shifting circuit of claim 4, wherein the transistor is a symmetrical, NMOS device.

6. An integrated circuit, comprising:

a level shifting circuit for converting a signal from a first level to a second level, the level shifting circuit including, (a) a first transistor having a first conduction terminal coupled for receiving the signal operating at the first level, a second conduction terminal coupled to a first node, and a control terminal coupled to a first bias terminal, and (b) a second transistor having a first conduction terminal coupled to the first node, a second conduction terminal coupled for providing the signal operating at the second level, and a control terminal coupled to a second bias terminal;

a first current sink device having an input coupled to the first bias terminal and having an output coupled to a ground potential terminal;

a first voltage clamping device having an input coupled to the first bias terminal and having an output coupled to the ground potential terminal;

a second current sink device having an input coupled to the second bias terminal and having an output coupled to the ground potential terminal; and a second voltage clamping device having an input coupled to the second bias terminal and having an output coupled to the ground potential terminal.

7. The integrated circuit of claim 6, further including a logic device coupled to receive an enable signal to provide an output signal to the control terminal of the first transistor.

8. A The integrated circuit of claim 6, wherein the first current sink device includes a transistor having a first conduction terminal coupled to the first bias terminal, and a control terminal and a second conduction terminal coupled together to the ground potential terminal.

9. The integrated circuit of claim 8, wherein the transistor is an NMOS device.

10. The integrated circuit of claim 6, wherein the first voltage clamping device includes a transistor having a first conduction terminal coupled to the first bias terminal, and a control terminal and a second conduction terminal coupled together to the ground potential terminal.

11. The integrated circuit of claim 10, wherein the transistor is an NMOS device.

12. The integrated circuit of claim 6, wherein the second current sink device includes a transistor having a first conduction terminal coupled to the second bias terminal, and a control terminal and a second conduction terminal coupled together to the ground potential terminal.

13. The integrated circuit of claim 12, wherein the transistor is an NMOS device.

14. The integrated circuit of claim 6, wherein the second voltage clamping device includes a transistor having a first conduction terminal coupled to the second bias terminal, and a control terminal and a second conduction terminal coupled together to the ground potential terminal.

15. The integrated circuit of claim 14, wherein the transistor is an NMOS device.

* * * * *